(12) United States Patent
Hosoda et al.

(10) Patent No.: US 10,271,428 B2
(45) Date of Patent: Apr. 23, 2019

(54) PROCESS FOR PRODUCING WIRING SUBSTRATE

(71) Applicant: AGC Inc., Chiyoda-ku (JP)

(72) Inventors: Tomoya Hosoda, Chiyoda-ku (JP); Toru Sasaki, Chiyoda-ku (JP); Nobutaka Kidera, Chiyoda-ku (JP); Tatsuya Terada, Chiyoda-ku (JP)

(73) Assignee: AGC Inc., Chiyoda-ku (JP)

( * ) Notice: Subject to any disclaimer, the term of this patent is extended or adjusted under 35 U.S.C. 154(b) by 0 days.

(21) Appl. No.: 15/926,014

(22) Filed: Mar. 20, 2018

(65) Prior Publication Data

US 2018/0213641 A1    Jul. 26, 2018

Related U.S. Application Data

(63) Continuation of application No. PCT/JP2016/081169, filed on Oct. 20, 2016.

(30) Foreign Application Priority Data

Oct. 22, 2015 (JP) .................................. 2015-208153

(51) Int. Cl.
| | |
|---|---|
| *H01K 3/10* | (2006.01) |
| *H05K 1/03* | (2006.01) |
| *H05K 1/11* | (2006.01) |
| *H05K 3/42* | (2006.01) |
| *H05K 3/46* | (2006.01) |
| *H05K 3/00* | (2006.01) |
| *H05K 3/38* | (2006.01) |

(52) U.S. Cl.
CPC ......... *H05K 1/0306* (2013.01); *H05K 1/0366* (2013.01); *H05K 1/0393* (2013.01);
(Continued)

(58) Field of Classification Search
CPC . H05K 2201/09563; H05K 2201/0959; H05K 2203/072; H05K 3/384;
(Continued)

(56) References Cited

U.S. PATENT DOCUMENTS

| | | | |
|---|---|---|---|
| 7,535,095 B1 * | 5/2009 | En ............................ | C23G 1/10 174/255 |
| 7,737,366 B2 * | 6/2010 | Shirai .................... | H05K 3/421 174/262 |
| 2007/0049146 A1 | 3/2007 | Lee et al. | |

FOREIGN PATENT DOCUMENTS

| | | |
|---|---|---|
| JP | 2000-015747 | 1/2000 |
| JP | 2001-007466 | 1/2001 |
| (Continued) | | |

OTHER PUBLICATIONS

International Search Report dated Jan. 17, 2017 in PCT/JP2016/081169 filed Oct. 20, 2016.

*Primary Examiner* — Thiem Phan
(74) *Attorney, Agent, or Firm* — Oblon, McClelland, Maier & Neustadt, L.L.P.

(57) ABSTRACT

To produce a wiring substrate having excellent electrical characteristics with conduction failure in a hole formed in a layer made of a fluororesin material sufficiently suppressed without conducting an etching treatment using metal sodium. A process for producing a wiring substrate, which comprises forming a hole in a laminate comprising a first conductor layer, a layer (A) which is made of a fluororesin material containing a melt-moldable fluororesin having specific functional groups and a reinforcing fiber substrate and which has a dielectric constant from 2.0 to 3.5, a second conductor layer, an adhesive layer and a layer (B) made of a cured product of a thermosetting resin laminated in this order, applying, to an inner wall surface of the hole, either one or both of a treatment with a permanganic acid solution and a plasma treatment without conducting an etching treatment using metal sodium, and then forming a plating layer.

15 Claims, 9 Drawing Sheets

(52) U.S. Cl.
CPC ............. *H05K 1/11* (2013.01); *H05K 3/0055* (2013.01); *H05K 3/42* (2013.01); *H05K 3/429* (2013.01); *H05K 3/46* (2013.01); *H05K 3/4688* (2013.01); *H05K 3/0038* (2013.01); *H05K 3/0047* (2013.01); *H05K 3/381* (2013.01); *H05K 3/427* (2013.01); *H05K 3/462* (2013.01); *H05K 2201/015* (2013.01); *H05K 2201/0129* (2013.01); *H05K 2203/095* (2013.01); *Y10T 29/49165* (2015.01)

(58) Field of Classification Search
CPC ............. H05K 2201/0278; H05K 3/42; H05K 1/0366; H05K 1/115; H05K 3/46; Y10T 29/49124; Y10T 29/49155; Y10T 29/49165
USPC .................................. 29/852, 825, 829, 846
See application file for complete search history.

(56) References Cited

FOREIGN PATENT DOCUMENTS

| | | |
|---|---|---|
| JP | 2007-055054 | 3/2007 |
| JP | 2007-118528 | 5/2007 |
| JP | 2007-314720 | 12/2007 |
| JP | 2008-258211 | 10/2008 |
| JP | 2011-051203 | 3/2011 |
| JP | 2015-176921 | 10/2015 |
| WO | WO 2010/084867 A1 | 7/2010 |

\* cited by examiner

PROCESS FOR PRODUCING WIRING SUBSTRATE

TECHNICAL FIELD

The present invention relates to a process for producing a wiring substrate.

BACKGROUND ART

High-speed large-capacity radio communication is widely used for not only information and communication terminals such as mobile phones but also automobiles, etc. In high-speed large-capacity radio communication, high frequency signals are transmitted by an antenna transmitting and receiving information. As an antenna, for example, a wiring substrate comprising an electrical insulator layer and a conductor layer formed on the electrical insulator layer is used. In the wiring substrate, in many cases, conductor layers are formed on both surfaces of the electrical insulator layer, and the conductor layers are electrically connected by a plating layer formed on an inner wall surface of a hole (through-hole) penetrating through the electrical insulator layer. Further, the antenna transmitting and receiving radio waves is, as the frequency of the radio waves becomes high for example, formed on a wiring substrate called e.g. a printed circuit board having an electronic circuit formed thereon, utilizing the wiring pattern of the electronic circuit in many cases.

The wiring substrate used for transmitting high frequency signals is required to have excellent transmission characteristics, that is, small transmission delay and small transmission loss. In order to improve the transmission characteristics, it is necessary to use, as an insulating material forming the electrical insulator layer, a material having a low dielectric constant and a low dielectric dissipation factor. As an insulating material having a low dielectric constant and a low dielectric dissipation factor, a fluororesin such as polytetrafluoroethylene (PTFE) has been known (for example, Patent Document 1). However, a fluororesin such as PTFE has a low surface energy and is non-adhesive. Accordingly, if a fluororesin layer is used as the electrical insulator layer, particularly adhesion between an inner wall surface of a hole formed in the fluororesin layer and a plating layer can hardly be secured sufficiently. For example, partial peeling of the plating layer formed on the inner wall surface of the hole may cause conduction failure.

Accordingly, use of a fluororesin having acid anhydride residues has been proposed (Patent Document 2). Adhesion between the fluororesin layer and the plating layer is improved by the acid anhydride residues. Further, in a fluororesin layer, reinforcing fibers such as glass fibers are blended in many cases for the purpose of bringing its linear expansion coefficient to be closer to the linear expansion coefficient of the conductor layer thereby to suppress deformation such as warpage. However, if reinforcing fibers such as glass fibers are contained in the fluororesin layer, adhesion between the inner wall surface of the hole formed in the fluororesin layer and the plating layer tends to decrease.

As a pre-treatment when the plating layer is formed on the inner wall surface of the hole formed in the fluororesin layer, an etching treatment with an etching liquid having metal sodium dissolved in tetrahydrofuran has been known. By such an etching treatment, the fluororesin on the inner wall surface of the hole is partially dissolved to roughen the inner wall surface, whereby adhesion between the inner wall surface of the hole and the plating layer will increase by the anchor effect. Further, fluorine atoms on the inner wall surface of the hole are replaced by e.g. hydroxy groups to lower water repellency, and accordingly the plating layer tends to be formed on the entire inner wall surface of the hole. By such an etching treatment, adhesion between the inner wall surface of the hole and the plating layer will be sufficiently high even if the fluororesin layer contains reinforcing fibers. However, metal sodium used for the etching treatment may ignite (explode) by contact with water, and great caution is needed for its handling and storage area. Further, since an organic solvent is used in a large amount, there are problems of health damage of an operator by intake, post-treatment, etc.

As a method of forming a plating layer without conducting an etching treatment using metal sodium on the inner wall surface of a hole formed in a fluororesin layer containing glass fibers, a method of blending silica with the fluororesin layer has been proposed (Patent Document 3). However, if silica is blended, the dielectric constant of the fluororesin layer tends to be high, and electrical characteristics tend to be low.

PRIOR ART DOCUMENTS

Patent Documents

Patent Document 1: JP-A-2001-7466
Patent Document 2: JP-A-2007-314720
Patent Document 3: JP-A-2000-15747

DISCLOSURE OF INVENTION

Technical Problem

It is an object of the present invention to provide a process for producing a wiring substrate, capable of producing a wiring substrate having excellent electrical characteristics with conduction failure in a hole formed in a fluororesin layer sufficiently suppressed even without conducting an etching treatment using metal sodium.

Solution to Problem

The present invention has the following constitutions.
[1] A process for producing a wiring substrate comprising:
a layer (A) which is made of a fluororesin material containing a melt-moldable fluororesin (a) having at least one type of functional groups selected from the group consisting of carbonyl group-containing groups, hydroxy groups, epoxy groups and isocyanate groups, and a reinforcing fiber substrate made of woven fabric or non-woven fabric, and which has a dielectric constant of from 2.0 to 3.5;
a first conductor layer formed on a first surface side of the layer (A);
a second conductor layer formed on a second surface side opposite from the first surface of the layer (A); and
at least one layer (B) made of a cured product of a thermosetting resin formed between any two of the layer (A) and the two conductor layers or outside of either of the two conductor layers; and
the wiring substrate having a hole which opens at least from the first conductor layer through the second conductor layer and having a plating layer formed on an inner wall surface of the hole;
the process comprising forming the hole in a laminate comprising the first conductor layer, the layer (A), the second conductor layer and the layer (B); and applying, to an inner wall surface of the hole formed, at least one of a treatment with a permanganic acid solution and a plasma treatment without conducting an etching treatment using metal sodium, and then forming the plating layer on the inner wall surface of the hole.

[2] A process for producing a wiring substrate comprising:

a layer (A) which is made of a fluororesin material containing a melt-moldable fluororesin (a) having at least one type of functional groups selected from the group consisting of carbonyl group-containing groups, hydroxy groups, epoxy groups and isocyanate groups, and a reinforcing fiber substrate made of woven fabric or non-woven fabric, and which has a dielectric constant of from 2.0 to 3.5;

a first conductor layer formed on a first surface side of the layer (A);

a second conductor layer formed on a second surface side opposite from the first surface of the layer (A); and at least one layer (B) made of a cured product of a thermosetting resin formed between the layer (A) and the second conductor layer or outside of the second conductor layer; and the wiring substrate having a hole which opens at least from the first conductor layer through the second conductor layer and having a plating layer formed on an inner wall surface of the hole;

the process comprising forming, in a laminate comprising the layer (A), the second conductor layer and the layer (B), a hole which opens at least from the first surface of the layer (A) through the second conductor layer;

applying, to an inner wall surface of the hole formed, at least one of a treatment with a permanganic acid solution and a plasma treatment without conducting an etching treatment using metal sodium, and then forming the plating layer on the inner wall surface of the hole; and then forming the first conductor layer on the first surface side of the layer (A).

[3] The process for producing a wiring substrate according to [1] or [2], wherein the wiring substrate has a layer structure of first conductor layer/layer (A)/second conductor layer/layer (B) or first conductor layer/layer (A)/layer (B)/second conductor layer.

[4] The process for producing a wiring substrate according to [1] or [2], wherein the wiring substrate further has, as layers constituting the wiring substrate, a third conductor layer and a fourth conductor layer and has a layer structure of first conductor layer/layer (A)/second conductor layer/layer (B)/third conductor layer/layer (B)/fourth conductor layer.

[5] The process for producing a wiring substrate according to [1] or [2], wherein the wiring substrate further has, as layers constituting the wiring substrate, an adhesive layer made of a resin material other than a cured product of a thermosetting resin, a third conductor layer and a fourth conductor layer and has a layer structure of first conductor layer/layer (A)/second conductor layer/adhesive layer/third conductor layer/layer (B)/fourth conductor layer.

[6] The process for producing a wiring substrate according to any one of [1] to [5], wherein the functional groups contain at least carbonyl group-containing groups, and the carbonyl group-containing groups are at least one member selected from the group consisting of groups having a carbonyl group between carbon atoms in a hydrocarbon group, carbonate groups, carboxy groups, haloformyl groups, alkoxycarbonyl groups and acid anhydride residues.

[7] The process for producing a wiring substrate according to any one of [1] to [6], wherein the content of the functional groups in the fluororesin (a) is from 10 to 60,000 groups per $1 \times 10^6$ carbon atoms in the main chain of the fluororesin (a).

[8] The process for producing a wiring substrate according to any one of [1] to [7], wherein the layer (A) has a dielectric constant of from 2.0 to 3.0.

[9] The process for producing a wiring substrate according to any one of [1] to [8], wherein the layer (A) has a linear expansion coefficient of from 0 to 35 ppm/° C.

[10] The process for producing a wiring substrate according to any one of [1] to [9], wherein the layer (B) contains glass fibers.

[11] A wiring substrate comprising:

a layer (A) which is made of a fluororesin material containing a melt-moldable fluororesin (a) having at least one type of functional groups selected from the group consisting of carbonyl group-containing groups, hydroxy groups, epoxy groups and isocyanate groups, and a reinforcing fiber substrate made of woven fabric or non-woven fabric, and which has a dielectric constant of from 2.0 to 3.5;

a first conductor layer formed on a first surface side of the layer (A);

a second conductor layer formed on a second surface side opposite from the first surface of the layer (A); and at least one layer (B) made of a cured product of a thermosetting resin formed between any two of the layer (A) and the two conductor layers or outside of either of the two conductor layers; and the wiring substrate having a hole which opens at least from the first conductor layer through the second conductor layer and having a plating layer formed on an inner wall surface of the hole.

[12] The wiring substrate according to [11], which has a layer structure of first conductor layer/layer (A)/second conductor layer/layer (B) or first conductor layer/layer (A)/layer (B)/second conductor layer.

[13] The wiring substrate according to [11], which further has, as layers constituting the wiring substrate, a third conductor layer and a fourth conductor layer and has a layer structure of first conductor layer/layer (A)/second conductor layer/layer (B)/third conductor layer/layer (B)/fourth conductor layer.

[14] The wiring substrate according to [11], which further has, as layers constituting the wiring substrate, an adhesive layer made of a resin material other than a cured product of a thermosetting resin, a third conductor layer and a fourth conductor layer and has a layer structure of first conductor layer/layer (A)/second conductor layer/adhesive layer/third conductor layer/layer (B)/fourth conductor layer.

[15] An antenna, which comprises the wiring substrate as defined in any one of [11] to [14], wherein at least one of the first conductor layer and the second conductor layer is a conductor layer having an antenna pattern.

Advantageous Effects of Invention

According to the process for producing a wiring substrate of the present invention, it is possible to produce a wiring substrate having excellent electrical characteristics with conduction failure in a hole formed in a fluororesin layer sufficiently suppressed even without conducting an etching treatment using metal sodium.

DESCRIPTION OF EMBODIMENTS

Figure 1A:
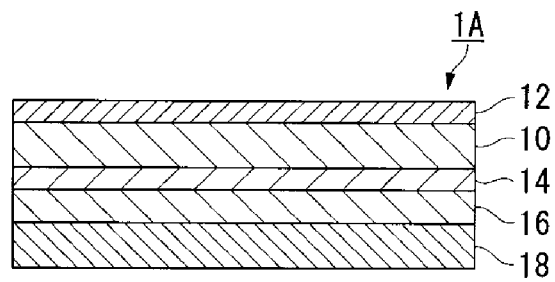
FIG. 1A is a cross-sectional view illustrating an example of a laminate used for a process for producing a wiring substrate of the present invention.

Meanings of the following terms in this specification are as follows.

The "melting point" means a temperature corresponding to the maximum value of the melting peak measured by differential scanning calorimetery (DSC) method.

"Melt-moldable" means having melt flowability.

"Having melt-flowability" means that a temperature at which the melt flow rate is from 0.1 to 1,000 g/10 min is present at a temperature higher by at least 20° C. than the melting point of the resin under a load of 49 N.

The "melt flow rate" means the melt mass flow rate (MFR) as defined in JIS K7210:1999 (ISO1133:1997).

The "dielectric constant" of a fluororesin means a value measured by transformer bridge method in accordance with ASTM D150, in an environment at a temperature of 23° C.±2° C. under a relative humidity of 50%±5% RH, at a frequency of 1 MHz.

The "dielectric constant" of a fluororesin material means a value measured by split post dielectric resonator method (SPDR method) in an environment at 23° C.±2° C. under 50%±5% RH, at a frequency of 2.5 GHz.

In this specification, a unit derived from a monomer will sometimes be referred to as a monomer unit. For example, a unit derived from a fluorinated monomer will sometimes be referred to as a fluorinated monomer unit.

[Wiring Substrate]

The wiring substrate to be produced by the production process of the present invention comprises a layer (A) which is made of a fluororesin material containing a melt-moldable fluororesin (a) having the after-descried functional groups (Q) and a reinforcing fiber substrate made of woven fabric or non-woven fabric and which has a dielectric constant of from 2.0 to 3.5, a first conductor layer, a second conductor layer, and a layer (B). The first conductor layer is formed on the first surface side of the layer (A), and the second conductor layer is formed on the second surface side opposite from the first surface of the layer (A). The layer (B) is a layer made of a cured product of a thermosetting resin, and at least one layer (B) is formed between any two of the layer (A) and the two conductor layers or outside of either of the two conductor layers.

The wiring substrate has a hole which opens at least from the first conductor layer through the second conductor layer, and has a plating layer formed on an inner wall surface of the hole.

In this specification, in the procedure for production of the wiring substrate, a laminate comprising the layer (A), the first conductor layer, the second conductor layer and the layer (B) is used.

The layer (B) may be formed between the layer (A) and the first conductor layer or the second conductor layer, or may be formed outside of the first conductor layer or the second conductor layer. The layer (B) in the wiring substrate may be one layer or two or more layers. Further, in a case where the layer (B) is formed outside of the first conductor layer or the second conductor layer, the wiring substrate may have other conductor layer adjacent to one or both sides of the layer (B). However, such other conductor layer is not in contact with the first conductor layer and the second conductor layer, and other layer (B) or the after-described adhesive layer is disposed between the conductor layers. Hereinafter in such an embodiment, it is considered that other conductor layers are present on the second conductor layer side, and will be referred to as a third conductor layer and a fourth conductor layer from the one closer to the second conductor layer.

The wiring substrate to be produced by the production process of the present invention may have a layer other than the layer (A), the first conductor layer, the second conductor layer and the layer (B). Other layer is not particularly limited and may, for example, be a conductor layer such as the above-described third conductor layer or fourth conductor layer, or an adhesive layer such as an adhesive layer disposed between the second conductor layer and the third conductor layer or an adhesive layer disposed between the second conductor layer and the layer (B).

The wiring substrate to be produced by the production process of the present invention has a hole formed so that it opens at least from the first conductor layer through the second conductor layer.

The hole formed in the wiring substrate is not limited so long as it opens at least from the first conductor layer through the second conductor layer, and it does not necessarily penetrate from one surface of the wiring substrate through the opposite surface. For example, in the case of a wiring substrate having the first conductor layer, the layer (A), the second conductor layer and the layer (B) laminated in this order, the hole is formed from the first conductor layer through the second conductor layer and is not necessarily formed in the layer (B).

The layer structure of the wiring substrate or laminate having the first conductor layer, the layer (A), the second conductor layer and the layer (B) laminated in this order will hereinafter be represented as "first conductor layer/layer (A)/second conductor layer/layer (B)". The layer structure of other wiring substrate or laminate will be referred to in the same manner.

As the wiring substrate to be produced by the production process of the present invention, for example, the following wiring substrates 1 to 5 may be mentioned.

Figure 1B:
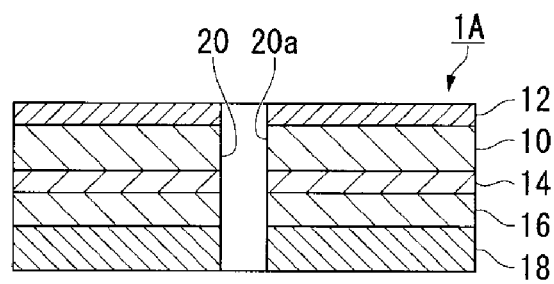
FIG. 1B is a cross-sectional view illustrating a state where a hole is formed in the laminate shown in FIG. 1A.
Figure 1C:
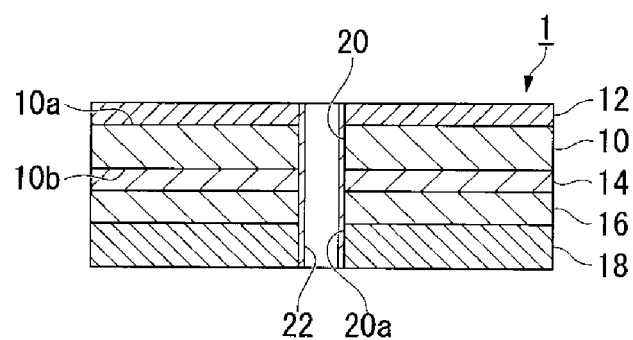
FIG. 1C is a cross-sectional view illustrating a state where a plating layer is formed on an inner wall surface of the hole in the laminate shown in FIG. 1B.

A wiring substrate 1 is, as shown in FIG. 1C, a wiring substrate having a layer structure of first conductor layer 12/layer (A) 10/second conductor layer 14/adhesive layer 16/layer (B) 18. The first conductor layer 12 is formed on a first surface 10a side of the layer (A) 10. The second conductor layer 14 is formed on a second surface 10b side of the layer (A) 10. The layer (B) 18 is formed on the opposite side of the second conductor layer 14 from the fluororesin layer (A) 10 via the adhesive layer 16. In the wiring substrate 1, a hole 20 which penetrates from the first conductor layer 12 though the layer (B) 18 is formed, and a plating layer 22 is formed on an inner wall surface 20a of the hole 20.

Figure 2A:
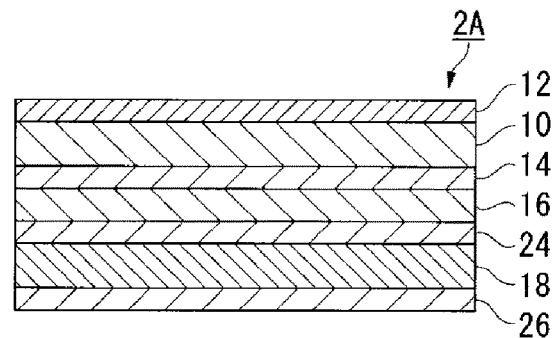
FIG. 2A is a cross-sectional view illustrating an example of a laminate used for a process for producing a wiring substrate of the present invention.
Figure 2B:
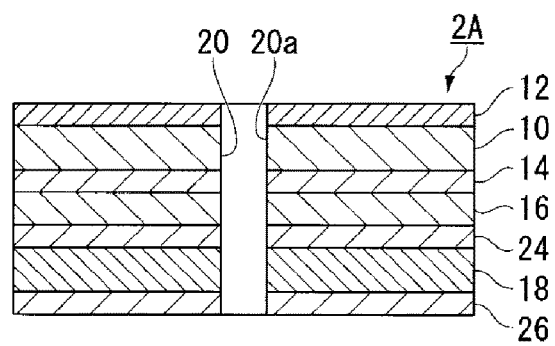
FIG. 2B is a cross-sectional view illustrating a state where a hole is formed in the laminate shown in FIG. 2A.
Figure 2C:
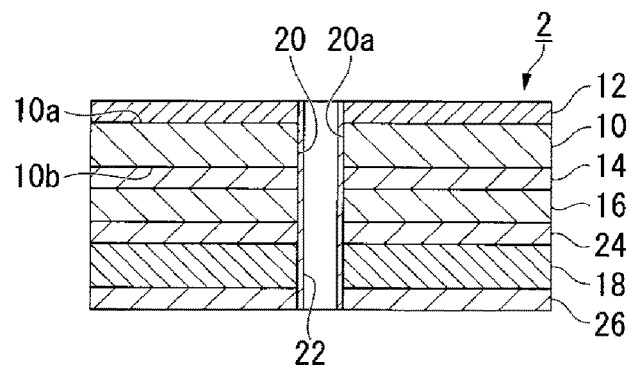
FIG. 2C is a cross-sectional view illustrating a state where a plating layer is formed on an inner wall surface of the hole in the laminate shown in FIG. 2B.

A wiring substrate 2 is, as shown in FIG. 2C, a wiring substrate having a layer structure of first conductor layer 12/layer (A) 10/second conductor layer 14/adhesive layer 16/third conductor layer 24/layer (B) 18/fourth conductor layer 26. In the wiring substrate 2, a hole 20 which penetrates from the first conductor layer 12 through the fourth conductor layer 26 is formed, and a plating layer 22 is formed on an inner wall surface 20a of the hole 20.

Figure 3A:
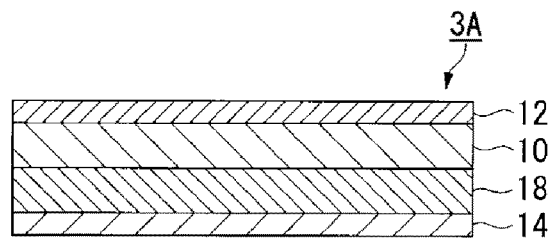
FIG. 3A is a cross-sectional view illustrating an example of a laminate used for a process for producing a wiring substrate of the present invention.
Figure 3B:
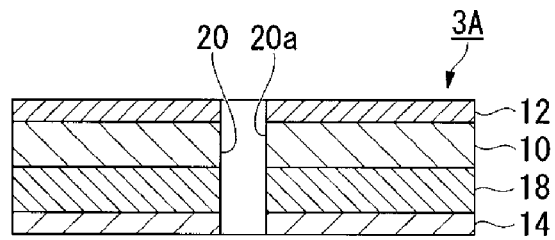
FIG. 3B is a cross-sectional view illustrating a state where a hole is formed in the laminate shown in FIG. 3A.
Figure 3C:
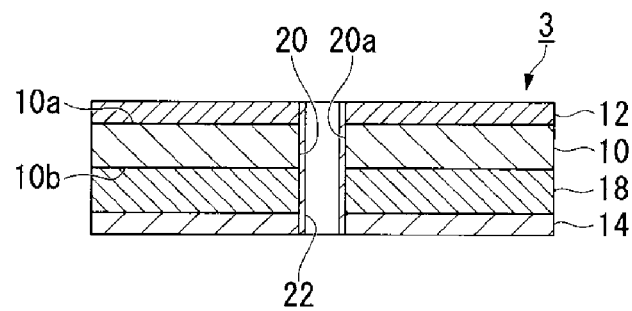
FIG. 3C is a cross-sectional view illustrating a state where a plating layer is formed on an inner wall surface of the hole in the laminate shown in FIG. 3B.

A wiring substrate 3 is, as shown in FIG. 3C, a wiring substrate having a layer structure of first conductor layer 12, layer (A) 10/layer (B) 18/second conductor layer 14. The layer (B) is formed on a second surface 10b side of the layer (A) 10. The second layer 14 is formed on the opposite side of the layer (B) 18 from the layer (A) 10.

In the wiring substrate 3, a hole 20 which penetrates from the first conductor layer 12 to the second conductor layer 14 is formed, and a plating layer 22 is formed on an inner wall surface 20a of the hole 20.

Figure 4A:
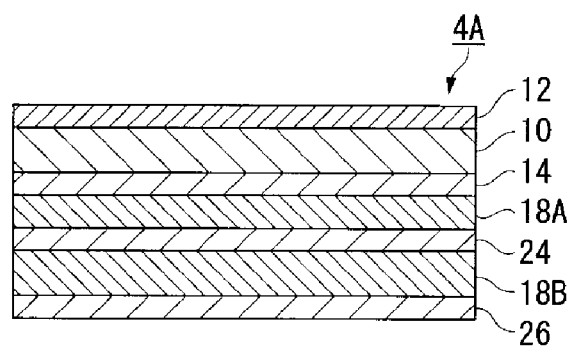
FIG. 4A is a cross-sectional view illustrating an example of a laminate used for a process for producing a wiring substrate of the present invention.
Figure 4B:
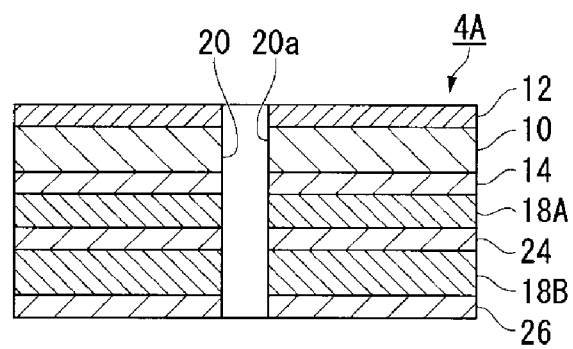
FIG. 4B is a cross-sectional view illustrating a state where a hole is formed in the laminate shown in FIG. 4A.
Figure 4C:
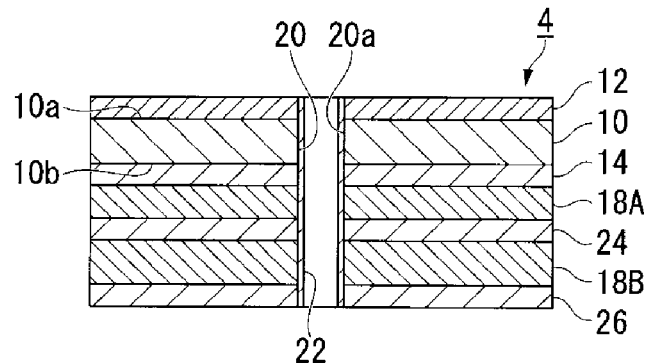
FIG. 4C is a cross-sectional view illustrating a state where a plating layer is formed on an inner wall surface of the hole in the laminate shown in FIG. 4B.

A wiring substrate 4 is, as shown in FIG. 4C, a wiring substrate having a layer structure of first conductor layer 12/layer (A) 10/second conductor layer 14/layer (B) 18A/third conductor layer 24/layer (B) 18B/fourth conductor layer 26. In the wiring substrate 4, a hole 20 which penetrates from the first conductor layer 12 through the fourth conductor layer 26 is formed, and a plating layer 22 is formed on an inner wall surface 20a of the hole 20.

Figure 5A:
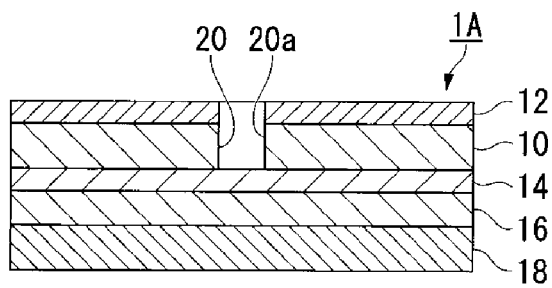
FIG. 5A is a cross-sectional view illustrating a state where a hole is formed in the laminate shown in FIG. 1A.
Figure 5B:
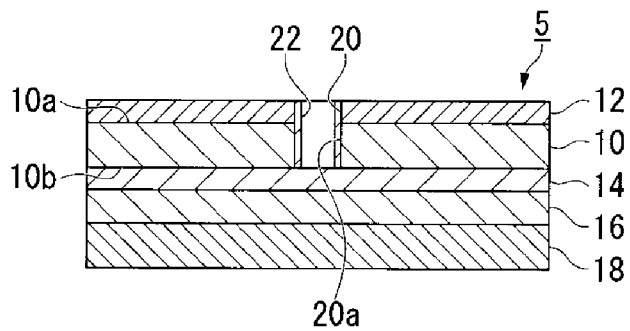
FIG. 5B is a cross-sectional view illustrating a state where a plating layer is formed on an inner wall surface of the hole in the laminate shown in FIG. 5A.

A wiring substrate 5 is, as shown in FIG. 5B, a wiring substrate having a layer structure of first conductor layer 12/layer (A) 10/second conductor layer 14/adhesive layer 16/layer (B) 18, in the same manner as the wiring substrate 1. In the wiring substrate 5, a hole 20 is formed from the first conductor layer 12 side through the boundary between the layer (A) 10 and the second conductor layer 14, and no hole is formed in the second conductor layer 14, the adhesive layer 16 and the layer (B) 18.

(Layer (A) and Fluororesin Material)

The fluororesin material constituting the layer (A) contains a melt-moldable fluororesin (a) having at least one type of functional groups (hereinafter sometimes referred to as "functional groups (Q)" selected from the group consisting of carbonyl group-containing groups, hydroxy groups, epoxy group and isocyanate groups, and a reinforcing fiber substrate made of woven fabric or non-woven fabric.

<Fluororesin (a)>

The fluororesin (a) may, for example, be a fluororesin (a1) having units (1) having a functional group (Q) and units (2) derived from tetrafluoroethylene (TFE). The fluororesin (a1) may further have units other than the units (1) and the units (2) as the case requires.

The carbonyl group-containing group as the functional group (Q) may be any group which contains a carbonyl group in its structure and may, for example, be a group having a carbonyl group between carbon atoms in a hydrocarbon group, a carbonate group, a carboxy group, a haloformyl group, an alkoxycarbonyl group, an acid anhydride residue, a polyfluoroalkoxycarbonyl group or a fatty acid residue. Particularly, in view of excellent adhesion to a conductor layer or a plating layer, preferred is at least one type selected from the group consisting of a group having a carbonyl group between carbon atoms in a hydrocarbon group, a carbonate group, a carboxy group, a haloformyl group, an alkoxycarbonyl group and an acid anhydride residue, more preferred is either one or both of a carboxy group and an acid anhydride residue.

In the group having a carbonyl group between carbon atoms in a hydrocarbon group, the hydrocarbon group may, for example, be a $C_{2-8}$ alkylene group. The number of carbon atoms in the alkylene group is a number of carbon atoms not including the carbonyl group. The alkylene group may be linear or branched.

The halogen atom in the haloformyl group may, for example, be a fluorine atom or a chlorine atom and is preferably a fluorine atom.

The alkoxy group in the alkoxycarbonyl group may be linear or branched. The alkoxy group is preferably a $C_{1-8}$ alkoxy group, particularly preferably a methoxy group or an ethoxy group.

The number of the functional group (Q) in the unit (1) may be one or more. In a case where the unit (1) has two or more functional groups (Q), such functional groups (Q) may be the same or different.

The monomer containing a carbonyl group-containing group may, for example, be an unsaturated dicarboxylic acid anhydride which is a compound having an acid anhydride residue and a polymerizable unsaturated bond, a monomer having a carboxy group (such as itaconic acid or acrylic acid), a vinyl ester (such as vinyl acetate), a methacrylate or an acrylate (such as a (polyfluoroalkyl)acrylate), or $CF_2=CFOR^{f1}CO_2X^1$ (wherein $R^{f1}$ is a $C_{1-10}$ perfluoroalkylene group which may contain an etheric oxygen atom, and $X^1$ is a hydrogen atom or a $C_{1-3}$ alkyl group).

The unsaturated dicarboxylic acid anhydride may, for example, be itaconic anhydride (IAN), citraconic anhydride (CAH), 5-norbornen-2,3-dicarboxylic anhydride (NAH) or maleic anhydride.

The monomer containing a hydroxy group may, for example, be a vinyl ester, a vinyl ether or an allyl ether.

The monomer containing an epoxy group may, for example, be allyl glycidyl ether, 2-methyl allyl glycidyl ether, glycidyl acrylate or glycidyl methacrylate.

The monomer containing an isocyanate group may, for example, be 2-acryloyloxyethyl isocyanate, 2-(2-acryloyloxyethoxy)ethyl isocyanate, 2-methacryloyloxyethyl isocyanate or 2-(2-methacryloyloxyethoxy)ethyl isocyanate.

The units (1) preferably have at least a carbonyl group-containing group as the functional group (Q) in view of excellent adhesion to the conductor layer or the plating layer. Further, the units (1) are, in view of excellent thermal stability and adhesion to the conductor layer or the plating layer, at least one member selected from the group consisting of IAN units, CAH units and NAH units, particularly preferably NAH units.

The units other than the units (1) and the units (2) may, for example, be units derived from other monomer such as a perfluoro(alkyl vinyl ether) (PAVE), hexafluoropropylene (HFP), vinyl fluoride, vinylidene fluoride (VdF), trifluoroethylene or chlorotrifluoroethylene (CTFE).

PAVE may, for example, be $CF_2=CFOCF_3$, $CF_2=CFOCF_2CF_3$, $CF_2=CFOCF_2CF_2CF_3$ (PPVE), $CF_2=CFOCF_2CF_2CF_2CF_3$ or $CF_2=CFO(CF_2)_8F$, and is preferably PPVE.

Other units are preferably PAVE units, particularly preferably PPVE units.

As a preferred fluororesin (a1), a TFE/PPVE/NAH copolymer, a TFE/PPVE/IAH copolymer and a TFE/PPVE/CAH copolymer may, for example, be mentioned.

The fluororesin (a) may have the functional group (Q) as the main chain terminal group. The functional group (Q) introduced as the main chain terminal group is preferably an alkoxycarbonyl group, a carbonate group, a carboxy group, a fluoroformyl group, an acid anhydride residue or a hydroxy group. Such a functional group may be introduced by properly selecting a radical polymerization initiator, a chain transfer agent or the like.

The content of the functional groups (Q) in the fluororesin (a) is preferably from 10 to 60,000 groups, more preferably from 100 to 50,000 groups, further preferably from 100 to 10,000 groups, particularly preferably from 300 to 5,000 groups per $1\times10^6$ carbon atoms in the main chain of the fluororesin (a). When the content of the functional groups (I) is within the above range, the adhesion strength at the interface between the layer (A) and the conductor layer or the layer (B) will be higher.

The content of the functional groups (Q) may be measured by e.g. nuclear magnetic resonance (NMR) analysis or infrared absorption spectrum analysis. For example, the proportion (mol %) of units having the functional groups (Q) based on all the units constituting the fluororesin (a) is determined by e.g. infrared absorption spectrum analysis as disclosed in e.g. JP-A-2007-314720, and the content of the functional groups (Q) can be calculated from the proportion.

The melting point of the fluororesin (a) is preferably from 260 to 320° C., more preferably from 295 to 315° C., further preferably from 295 to 310° C. When the melting point of the fluororesin (a) is at least the above lower limit value, the layer (A) will be excellent in the heat resistance. When the melting point of the fluororesin (a) is at most the above upper limit value, the fluororesin (a) is excellent in the forming property.

The melting point of the fluororesin (a) may be adjusted e.g. by the type or the proportion of units constituting the fluororesin (a), the molecular weight of the fluororesin (a), etc.

The melt flow rate (MFR) of the fluororesin (a) at 372° C. under a load of 49 N is preferably from 0.1 to 1,000 g/10 min, more preferably from 0.5 to 100 g/min, further preferably from 1 to 30 g/10 min. When the melt flow rate is at most the above upper limit value, the solder heat resistance tends to improve. When the melt flow rate is at least the above lower limit value, the fluororesin (a) is excellent in the forming property.

The melt flow rate is an index to the molecular weight of the fluororesin (a), and a high melt flow rate indicates a low molecular weight and a low melt flow rate indicates a high molecular weight. The melt flow rate of the fluororesin (a) may be adjusted by conditions for producing the fluororesin (a). For example, by shortening the polymerization time at the time of polymerization, the melt flow rate of the resulting fluororesin (a) tends to be high. Further, by reducing the amount of the radical polymerization initiator used at the time of production, the melt flow rate of the resulting fluororesin (a) tends to be low.

The dielectric constant of the fluororesin (a) is preferably from 2.0 to 3.2, more preferably from 2.0 to 3.0. The lower the dielectric constant of the fluororesin (a), the more the dielectric constant of the fluororesin material can be lowered.

The dielectric constant of the fluororesin (a) may be adjusted, for example, by the content of the units (2). The higher the content of the units (2), the lower the dielectric constant of the fluororesin (a) tends to be.

<Reinforcing Fiber Substrate>

The fluororesin material contains a reinforcing fiber substrate made of woven fabric or non-woven fabric, whereby sufficient dimensional accuracy and mechanical strength of the layer (A) will be secured. As reinforcing fibers forming the reinforcing fiber substrate, glass fibers or carbon fibers may, for example, be mentioned, and glass fibers are preferred.

As the material of the glass fibers, E-glass, C-glass, A-glass, S-glass, D-glass, NE-glass, T-glass, quartz, low dielectric constant glass or high dielectric constant glass may, for example, be mentioned. Among them, in view of availability, E-glass, S-glass, D-glass or NE-glass is preferred.

The glass fibers may be surface-treated with a known surface treating agent such as a silane coupling agent, whereby the adhesion to the fluororesin will improve, and mechanical strength, heat resistance and through-hole reliability will improve.

As the reinforcing fiber substrate, woven fabric is preferred to non-woven fabric, and glass cloth is particularly preferred.

The content of the reinforcing fiber substrate in the layer (A) is preferably from 1 to 90 parts by mass, more preferably from 2 to 80 parts by mass, particularly preferably from 5 to 60 parts by mass per 100 parts by mass of the fluororesin (a). When the content of the reinforcing fiber substrate is within the above range, the layer (A) will be excellent in the forming property and the heat resistance.

<Other Component>

The fluororesin material may contain other component such as a resin other than the fluororesin (a), or additives, within a range not to impair the effects of the present invention.

The resin other than the fluororesin (a) may, for example, be polyimide (such as aromatic polyimide), polyarylate, polysulfone, polyarylsulfone (such as polyethersulfone), aromatic polyamide, aromatic polyether amide, polyphenylene sulfide, polyaryletherketone, polyamide-imide or liquid crystalline polyester.

The additive is preferably an inorganic filler having a low dielectric constant and a low dielectric dissipation factor. Such an inorganic filler may, for example, be silica, clay, talc, calcium carbonate, mica, diatomaceous earth, alumina, zinc oxide or titanium oxide.

The dielectric constant of the fluororesin material is from 2.0 to 3.5, preferably from 2.0 to 3.0. When the dielectric constant of the fluororesin material is at most the above upper limit value, such a fluororesin material is useful for an application for which a low dielectric constant is required, such as an antenna. When the dielectric constant of the fluororesin material is at least the above lower limit value, both electrical characteristics and adhesion will be excellent.

The linear expansion coefficient of the layer (A) is preferably from 0 to 35 ppm/° C., more preferably from 0 to 30 ppm/° C. The linear expansion coefficient of the layer (A) means a linear expansion coefficient in a plane direction of the layer (A). When the linear expansion coefficient of the layer (A) is at most the above upper limit value, the difference in the linear expansion coefficient with the conductor layer tends to be small, and deformation such as warpage on the wiring substrate tends to be suppressed.

The linear expansion coefficient of the layer (A) is determined by the method disclosed in Examples.

The thickness of the layer (A) is preferably from 10 to 500 μm, more preferably from 20 to 300 μm. When the thickness of the layer (A) is at least the above lower limit value, the wiring substrate is less likely to be deformed, and the conductor layer is less likely to be disconnected. When the thickness of the layer (A) is at most the above upper limit value, such a layer will be excellent in flexibility, and contribute to downsizing and weight saving of the resulting wiring substrate.

(Conductor Layer)

As the conductor layer, a metal foil having a low electrical resistance is preferred. The metal foil may be a foil made of a metal such as copper, silver, gold or aluminum. The metal may be used alone or in combination of two or more. In a case where two or more metals are used in combination, the metal foil is preferably a metal foil having metal plating applied thereto, particularly preferably a copper foil having gold plating applied thereto.

The thickness of the conductor layer is preferably from 0.1 to 100 μm per layer, more preferably from 1 to 50 μm, particularly preferably from 1 to 30 μm.

The types of the metal material and the thicknesses of the respective conductor layers may be different.

With respect to the conductor layer, the surface on the layer (A) side may be roughened, with a view to reducing the skin effect when transmitting signals in a high frequency band. On the surface opposite from the roughened surface of the conductor layer, an anti-corrosive oxide coating of e.g. chromate may be formed.

The conductor layer may have a wiring formed by pattern forming as the case requires. Further, the conductor layer may have a form other than a wiring.

(Plating Layer)

The plating layer is not limited so long as conduction between the first conductor layer and the second conductor layer is secured through the plating layer. The plating layer may, for example, be a copper plating layer, a gold plating layer, a nickel plating layer, a chromium plating layer, a zinc plating layer or a tin plating layer, and is preferably a copper plating layer.

(Layer (B))

The layer (B) is a layer made of a cured product of a thermosetting resin.

The thermosetting resin may, for example, be a polyimide resin, an epoxy resin, a thermosetting acrylic resin, a phenol resin, a thermosetting polyester resin, a bismaleimide resin, a thermosetting polyolefin resin, a thermosetting polyphenylene ether resin or a thermosetting fluororesin. Among them, the thermosetting resin is preferably a polyimide resin, an epoxy resin, a thermosetting acrylic resin, a bismaleimide resin or a thermosetting polyphenylene ether resin, more preferably at least one member selected from the group consisting of a polyimide resin and an epoxy resin.

The thermosetting resin may be used alone or in combination of two or more.

The polyimide resin is preferably an aromatic polyimide, more preferably a wholly aromatic polyimide obtained by condensation polymerization of an aromatic polyvalent carboxylic dianhydride and an aromatic diamine.

As the aromatic polyvalent carboxylic dianhydride compounds disclosed in JP-A-2012-145676, paragraph [0055] may, for example, be mentioned. Further, ethylene tetracarboxylic dianhydride and cyclopentanetetracarboxylic dianhydride which are non-aromatic polyvalent carboxylic dianhydrides can be used comparably to the aromatic polyvalent carboxylic dianhydride.

As the aromatic diamine, compounds disclosed in JP-A-2012-145676, paragraph [0057] may, for example, be mentioned.

The polyimide resin may be used alone or in combination of two or more.

The epoxy resin may, for example, be a cresol novolac epoxy resin, a bisphenol A epoxy resin, a bisphenol F epoxy resin, a phenol novolac epoxy resin, an alkylphenol novolac epoxy resin, a bisphenol F epoxy resin, a naphthalene epoxy resin, a dicyclopentadiene epoxy resin, an epoxidized product of a condensate of a phenol and an aromatic aldehyde having a phenolic hydroxy group, triglycidyl isocyanurate or an alicyclic epoxy resin.

The epoxy resin may be used alone or in combination of two or more.

The weight average molecular weight of the thermosetting resin is preferably from 100 to 1,000,000, more preferably from 1,000 to 100,0000. When the weight average molecular weight of the thermosetting resin is at least the above lower limit value, excellent heat resistance tends to be obtained. When the weight average molecular weight of the thermosetting resin is at most the above upper limit value, a varnish which is a solution of the thermosetting resin tends to have a low viscosity and tends to be excellent in the storage stability.

The weight average molecular weight of the thermosetting resin is measured by gel permeation chromatography (GPC).

The thermosetting resin forming the layer (B) is used in an uncured state at a stage where the respective layers are laminated, and then cured to form the layer (B). Further, the thermosetting resin may be used as a material of the adhesive layer. In such a case, the thermosetting resin is cured to form the layer (B), and then hole processing is conducted.

The layer (B) preferably contains reinforcing fibers, whereby the adhesion between the inner wall surface of the hole and the plating layer tends to be more secured, and the plating layer tends to be formed on the entire inner wall surface of the hole. The reinforcing fibers are preferably the same reinforcing fibers as those contained in the fluororesin material, particularly preferably glass fibers.

The state of the glass fibers contained in the layer (B) is not particularly limited and may, for example, be a state of woven fabric or non-woven fabric, or a state of a plurality of continuous glass fibers stretch-assembled in one direction.

The material containing the uncured thermosetting resin and the reinforcing fibers is preferably a sheet-shaped or a film-shaped prepreg, and it is preferred to cure the thermosetting resin to form the layer (B).

In a case where the layer (B) contains glass fibers, the content of the glass fibers in the layer (B) is preferably from 1 to 1,000 parts by mass, more preferably from 5 to 500 parts by mass per 100 parts by mass of the cured resin in the layer (B). When the content of the glass fibers is at least the above lower limit value, deformation such as warpage tends to be controlled. When the content of the glass fibers is at most the above upper limit value, adhesion between the inner wall surface of the hole and the plating plate tends to be sufficiently secured, and the plating layer tends to be formed on the entire inner wall surface of the hole.

The layer (B) may contain an additive such as carbon fibers or an inorganic filler. The additive may, for example, be the same additive described for the layer (A).

The number of the layer (B) in the wiring substrate or the laminate used in the present invention is not limited to one, and may be two or more.

The thickness of the layer (B) is preferably from 12 to 3,000 µm per layer, more preferably from 25 to 1,000 µm. When the thickness of the layer (B) is at least the above lower limit value, the adhesion between the inner wall surface of the hole and the plating layer tends to be sufficiently secured, and the plating layer tends to be formed on the entire inner wall surface of the hole. When the thickness of the layer (B) is at most the above upper limit value, the wiring substrate can be made thin, and space saving can be realized.

(Adhesive Layer)

The adhesive material forming the adhesive layer is not particularly limited and may, for example, be a film or sheet of a heat-sealable thermoplastic resin. The film or sheet may contain reinforcing fibers such as glass fibers or an additive such as an inorganic filler.

The adhesive material forming the adhesive layer may be an uncured thermosetting resin capable of forming the layer (B) or the above-described prepreg.

In a case where an uncured thermosetting resin or the prepreg is used as the adhesive material and the thermosetting resin is cured before forming the hole, the layer made of the cured product is the layer (B).

As the application of the wiring substrate of the present invention, preferred is an antenna wherein at least one of the first conductor layer and the second conductor layer has an antenna wiring. As the antenna, antennas disclosed in WO2016/121397 may, for example, be mentioned. The application of the wiring substrate of the present invention is not limited to an antenna, and the wiring substrate may be used as a printed wiring board such as a sensor or a communication device used particularly in a high frequency circuit.

The wiring substrate is useful also as a substrate for electronic equipment such as radar, a network router, a backplane or a wireless infrastructure for which high frequency characteristics are required, or a substrate for various sensors or a substrate for engine management sensors for automobiles, and is particularly useful to an application for which a reduction in the transmission loss in a millimeter wave band is required.

[Process for Producing Wiring Substrate]

The process for producing a wiring substrate of the present invention is roughly classified into the following process (i) and process (ii) depending upon whether a laminate on which hole processing is to be conducted has the first conductor layer or not.

Process (i): A process of conducting hole processing on a laminate having a first conductor layer.

Process (ii): A process of conducting hole processing on a laminate having no first conductor layer.

Now, the process (i) and the process (ii) will be respectively described.

(Process (i))

The process (i) has the following steps.

(i-1): A step of forming, in a laminate comprising the first conductor layer, the layer (A) and the second conductor layer laminated in this order and having the layer (B) further laminated between any two of the layers or outside of either of the two conductor layers, a hole which opens at least from the first conductor layer through the second conductor layer.

(i-2): A step of applying, to an inner wall surface of the hole formed in the laminate, one or both of a treatment with a permanganic acid solution and a plasma treatment without conducting an etching treatment using metal sodium.

(i-3): A step of forming a plating layer on the inner wall surface of the hole after the step (i-2).

<Step (i-1)>

For hole processing, a laminate having the layer (B) laminated in addition to the first conductor layer, the layer (A) and the second conductor layer is used. The layer (B) may be laminated between any two of the first conductor layer, the layer (A) and the second conductor layer, or may be formed outside of the first conductor layer or outside of the second conductor layer. The laminate used in the step (i-1) may have, in addition to the first conductor layer, the layer (A), the second conductor layer and the layer (B), other layer such as another conductor layer or an adhesive layer laminated.

The method for producing the laminate is not particularly limited and a known method may be employed.

A laminate having a structure of first conductor layer/layer (A)/second conductor layer/layer (B) may be obtained, for example, by the following method. A metal foil, a resin film made of the fluororesin (a), a reinforcing fiber substrate, a resin film made of the fluororesin (a) and a metal foil are laminated in this order and heat-pressed, to obtain a precursor laminate having a structure of first conductor layer/layer (A)/second conductor layer. On the precursor layer, a film or sheet made of a cured product of a thermosetting resin is laminated by using an adhesive material to obtain a laminate having a structure of first conductor layer/layer (A)/second conductor layer/adhesive layer/layer (B). A conductor layer may be formed on one surface or on both surfaces of the film or sheet to be laminated on the precursor laminate and be the layer (B).

Otherwise, a metal foil, a resin film made of the fluororesin (a), a reinforcing fiber substrate, a resin film made of the fluororesin (a), a metal foil and a prepreg are laminated in this order and heat-pressed to produce a laminate having a structure of first conductor layer/layer (A)/second conductor layer/layer (B) in one step.

Further, a metal foil, a resin film made of the fluororesin (a), a reinforcing fiber substrate, a resin film made of the fluororesin (a), a metal foil, a prepreg, a metal foil, a prepreg and a metal foil are laminated in this order and heat-pressed to produce a laminate having a structure of first conductor layer/layer (A)/second conductor layer/layer (B)/third conductor layer/layer (B)/fourth conductor layer in one step. In such a case, a prepreg having a metal foil preliminarily laminated on both surfaces may be used to form the above structure of third conductor layer/layer (B)/fourth conductor layer. Further, the layer (B) between the second conductor layer and the third conductor layer may be an adhesive, for example, an adhesive layer may be formed by using a heat-sealable thermoplastic resin film.

A laminate having a structure of first conductor layer/layer (A)/layer (B)/second conductor layer may be obtained, for example, by the following method. A metal foil, a resin film made of the fluororesin (a), a reinforcing fiber substrate, a resin film made of the fluororesin (a), a resin film made of an uncured thermosetting resin and a metal foil are laminated in this order and heat-pressed. In the similar method, a laminate having a structure of first conductor layer/layer (B)/layer (A)/second conductor layer may be obtained.

The hole is formed so that it opens at least from the first conductor layer through the second conductor layer. That is, the hole is formed so that it penetrates at least the layer (A) positioned between the first conductor layer and the second conductor layer. In a case where the hole is formed from the first conductor layer side of the layer (A), so long as the first conductor layer and the second conductor layer are connected by the hole, the hole may or may not reach the interior of the second conductor layer. In a case where the hole is formed from the second conductor layer side of the layer (A), so long as the first conductor layer and the second conductor layer are connected by the hole, the hole may or may not reach the interior of the first conductor layer.

In a case where the layer (B) is laminated between any two of the first conductor layer, the layer (A) and the second conductor layer, the hole is formed so that it penetrates the layer (A) and the layer (B). In a case where the layer (B) is laminated outside of the second conductor layer, the hole may or may not reach the interior of the layer (B). The same applies to a case where another conductor layer or an adhesive layer is laminated between or outside of the first conductor layer, the layer (A) and the second conductor layer.

The method of forming the hole in the laminate is not particularly limited, and a known method may be employed, such as a method of forming a hole by a drill or a laser.

The diameter of the hole formed in the laminate is not particularly limited and may properly be determined.

<Step (i-2)>

After the hole is formed in the laminate and before a plating layer is formed on the inner wall surface of the hole, as a pre-treatment, either one or both of a treatment with a permanganic acid solution and a plasma treatment is applied to the inner wall surface of the hole. In the step (i-2), an etching treatment using metal sodium is not conducted as the pre-treatment.

In a case where both of the treatment with a permanganic acid solution and a plasma treatment are conducted as the pre-treatment, it is preferred to conduct the treatment with a permanganic acid solution first in view of removability of smear (resin residue) which forms at the time of forming the hole, and in that the adhesion between the inner wall surface of the hole and the plating layer will sufficiently be secured and the plating layer will readily be formed on the entire inner wall surface of the hole. However, the treatment with a permanganic acid solution may be conducted after the plasma treatment.

<Step (i-3)>

The method of forming the plating layer on the inner wall surface of the hole after the pre-treatment is not particularly limited and for example, electroless plating may be mentioned.

In the present invention, by the layer (B) being laminated in the laminate when the plating layer is formed on the inner wall surface of the hole formed in the laminate, the plating layer is formed on the entire inner wall surface of the hole, and conduction between the first conductor layer and the second conductor layer is stably secured. The reason why such effects are obtained is not necessarily clearly understood but is considered as follows.

The reinforcing fiber substrate has low adhesion to the plating layer as compared with the fluororesin (a). Accordingly, in a case where the reinforcing fiber substrate is contained in the layer (A), the adhesion between the inner wall surface of the hole and the plating layer tends to be low as compared with a case where no reinforcing fiber substrate is contained. Further, since the fluororesin (a) is flexible, the inner wall surface of the hole formed in the layer (A) may be deformed at the time of plating treatment, and this deformation leads to a further decrease of the adhesion between the inner wall surface of the hole and the plating layer, whereby the plating layer is partially peeled. Whereas, in the present invention, since the layer (B) is laminated in the laminate, the layer (A) is firmly fixed at the time of plating treatment, and deformation of the inner wall surface is suppressed. Thus, the adhesion between the inner wall surface of the hole and the plating layer is sufficiently secured, and the plating layer is formed on the entire inner wall surface of the hole.

Now, an example of the process (i) will be described.

First Embodiment

In a case where the wiring substrate 1 is produced by the process (i), a laminate 1A having a layer structure of first conductor layer 12/layer (A) 10/second conductor layer 14/adhesive layer 16/layer (B) 18 as shown in FIG. 1A is used. As shown in FIG. 1B, a hole 20 which penetrates from the first conductor layer 12 through the layer (B) 18 is formed in the laminate 1A e.g. by a drill or laser. Then, either one or both of a treatment with a permanganic acid solution and a plasma treatment is applied to an inner wall surface 20a of the hole 20 formed without conducting an etching treatment using metal sodium, and then as shown in FIG. 1C, e.g. electroless plating is applied to the inner wall surface 20a of the hole 20 to form a plating layer 22.

Second Embodiment

In a case where a wiring substrate 2 is produced by the process (i), a laminate 2A having a layer structure of first conductor layer 12/layer (A) 10/second conductor layer 14/adhesive layer 16/third conductor layer 24/layer (B) 18/fourth conductor layer 26, as shown in FIG. 2A, is used. In the same manner as in the case of the wiring substrate 1, as shown in FIG. 2B, a hole 20 which penetrates from the first conductor layer 12 through the fourth conductor layer 26 is formed in the laminate 2A. Then, either one or both of a treatment with a permanganic acid solution and a plasma treatment is applied to an inner wall surface 20a of the hole 20 formed without conducting an etching treatment using metal sodium, and then as shown in FIG. 2C, a plating layer 22 is formed on the inner wall surface 20a of the hole 20.

Third Embodiment

In a case where a wiring substrate 3 is produced by the process (i), a laminate 3A having a layer structure of first conductor layer 12/layer (A) 10/layer (B) 18/second conductor layer 14, as shown in FIG. 3A, is used. In the same manner as in the case of the wiring substrate 1, as shown in FIG. 3B, a hole 20 which penetrates from the first conductor layer 12 through the second conductor layer 14 is formed in the laminate 2A. Then, either one or both of a treatment with a permanganic acid solution and a plasma treatment is applied to an inner wall surface 20a of the hole 20 formed without conducting an etching treatment using metal sodium, and then as shown in FIG. 3C, a plating layer 22 is formed on the inner wall surface of the hole 20.

Fourth Embodiment

In a case where a wiring substrate 4 is produced by the process (i), a laminate 4A having a layer structure of first conductor layer 12/layer (A) 10/second conductor layer 14/layer (B) 18A/third conductor layer 24/layer (B) 18B/fourth conductor layer 26, as shown in FIG. 4A, is used. In the same manner as in the case of the wiring substrate 1, as shown in FIG. 4B, a hole 20 which penetrates from the first conductor layer 12 through the fourth conductor layer 26 is formed in the laminate 4A, and as shown in FIG. 4C, a plating layer 22 is formed on an inner wall surface 20a of the hole 20.

The laminate 4A is obtained, for example, by bonding a precursor laminate having a layer structure of first conductor layer 12/layer (A) 10/second conductor layer 14 and a precursor laminate having a layer structure of third conductor layer 24/layer (B) 18B/fourth conductor layer 26 via a prepreg containing an uncured thermosetting resin and then by curing the prepreg. In such a case, the cured product of the prepreg becomes the layer (B) 18A.

Fifth Embodiment

In a case where a wiring substrate 5 is produced by the process (i), the same laminate 1A as in the case of the wiring substrate 1, as shown in FIG. 1A, is used. And, as shown in FIG. 5A, a hole 20 is formed from the first conductor layer 12 to the boundary between the layer (A) 10 and the second conductor layer 14 is formed e.g. by a drill or a laser. Then, either one or both of a treatment with a permanganic acid solution and a plasma treatment is applied to an inner wall surface 20a of the hole 20 formed without conducting an etching treatment using metal sodium, and then as shown in FIG. 5B, a plating layer 22 is formed by e.g. electroless plating on the inner wall surface 20a of the hole 20.

(Process (ii))

The process (ii) has the following steps.

(ii-1): A step of forming, in a laminate having the layer (A) and the second conductor layer laminated and the layer (B) laminated between these layers or on the opposite side of the second conductor layer from the layer (A), a hole which opens at least from a first surface of the layer (A) through the second conductor layer.

(ii-2): A step of applying, to an inner wall surface of the hole formed in the laminate, either one or both of a treatment with a permanganic acid solution and a plasma treatment without conducting an etching treatment using metal sodium.

(ii-3): A step of forming a plating layer on the inner wall surface of the hole after the step (ii-2).

(ii-4): A step of forming the first conductor layer on the first surface side of the layer (A).

<Step (ii-1)>

The step (ii-1) may be carried out in the same manner as the step (i-1) using the same laminate as in the process (i) except that it has no first conductor layer, except that a hole which opens at least from the first surface of the layer (A) through the second conductor layer is formed.

<Step (ii-2), step (ii-3)>

The step (ii-2) and the step (ii-3) may be carried out in the same manner as the step (i-2) and the step (i-3) except that the laminate having the hole formed in the step (ii-1) is used.

<Step (ii-4)>

The method of forming the first conductor layer on the first surface side of the layer (A) is not particularly limited and for example, electroless plating may be mentioned. Further, as the case requires, a pattern may be formed on the first conductor layer by an etching treatment.

The step (ii-4) may be carried out before the step (ii-3), may be carried out after the step (ii-3), or may be carried out simultaneously with the step (ii-3).

Now, an example of the process (ii) will be described.

Sixth Embodiment

In a case where a wiring substrate 1 is produced by the process (ii), for example, the following process may be mentioned.

Figure 6A:
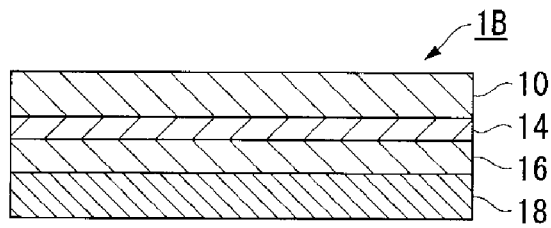
FIG. 6A is a cross-sectional view illustrating an example of a laminate used for a process for producing a wiring substrate of the present invention.
Figure 6B:
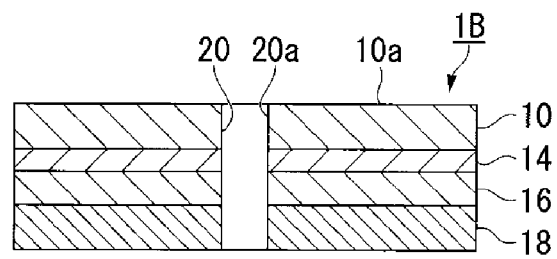
FIG. 6B is a cross-sectional view illustrating a state where a hole is formed in the laminate shown in FIG. 6A.
Figure 6C:
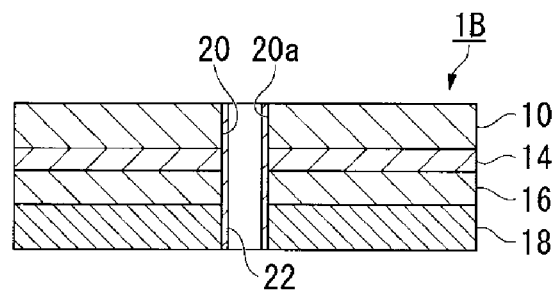
FIG. 6C is a cross-sectional view illustrating a state where a plating layer is formed on an inner wall surface of the hole in the laminate shown in FIG. 6B.
Figure 6D:
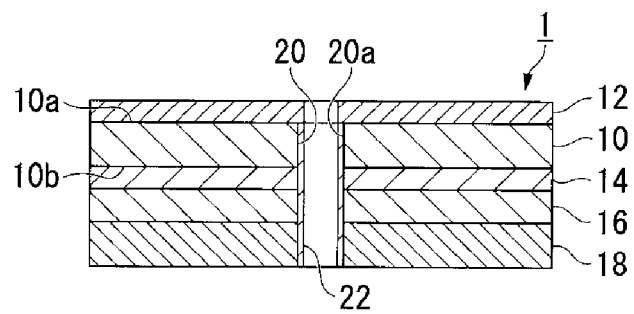
FIG. 6D is a cross-sectional view illustrating a state where a first conductor layer is formed on the first surface side of the layer (A) of the laminate shown in FIG. 6C.

A laminate 1B having a layer structure of layer (A) 10/second conductor layer 14/adhesive layer 16/layer (B) 18 as shown in FIG. 6A is used. As shown in FIG. 6B, a hole 20 which penetrates from the layer (A) 10 through the layer (B) 18 is formed in the laminate 1B e.g. by a drill or laser. Then, either one or both of a treatment with a permanganic acid solution and a plasma treatment is applied to an inner wall surface 20a of the hole 20 formed without conducting an etching treatment using metal sodium. Then, as shown in FIG. 6C, a plating layer 22 is formed by applying e.g.

electroless plating on the inner wall surface 20a of the hole 20. Then, as shown in FIG. 6D, the first conductor layer 12 is formed by applying e.g. electroless plating on the first surface 10a side of the layer (A) 10.

Seventh Embodiment

Figure 7A:
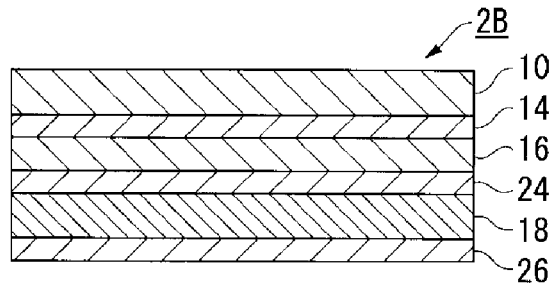
FIG. 7A is a cross-sectional view illustrating an example of a laminate used for a process for producing a wiring substrate of the present invention.
Figure 7B:
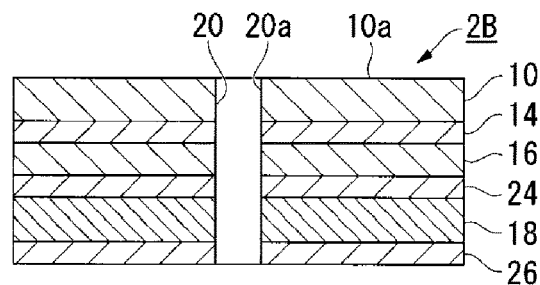
FIG. 7B is a cross-sectional view illustrating a state where a hole is formed in the laminate shown in FIG. 7A.
Figure 7C:
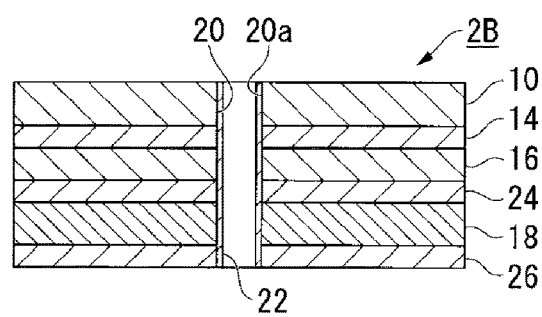
FIG. 7C is a cross-sectional view illustrating a state where a plating layer is formed on an inner wall surface of the hole in the laminate shown in FIG. 7B.
Figure 7D:
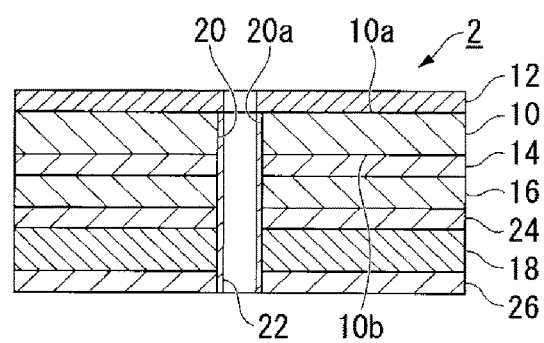
FIG. 7D is a cross-sectional view illustrating a state where a first conductor layer is to formed on the first surface side of the layer (A) of the laminate shown in FIG. 7C.

In a case where a wiring substrate 2 is produced by the process (ii), a laminate 2B having a layer structure of layer (A) 10/second conductor layer 14/adhesive layer 16/third conductor layer 24/layer (B) 18/fourth conductor layer 26 as shown in FIG. 7A is used. In the same manner as in the case of the wiring substrate 1, as shown in FIG. 7B, a hole 20 which penetrates from the layer (A) through the fourth conductor layer 26 is formed in the laminate 2B. And, either one or both of a treatment with a permanganic acid solution and a plasma treatment is applied to an inner wall surface 20a of the hole 20 formed without conducting an etching treatment using metal sodium. Then, as shown in FIG. 7C, a plating layer 22 is formed on the inner wall surface 20A of the hole 20, and as shown in FIG. 7D, a first conductor layer 12 is formed on a first surface 10a side of the layer (A) 10.

Eighth Embodiment

Figure 8A:
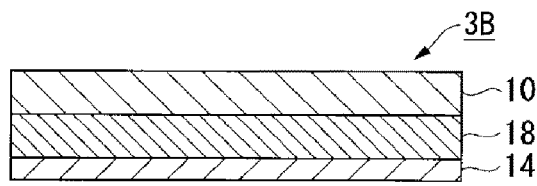
FIG. 8A is a cross-sectional view illustrating an example of a laminate used for a process for producing a wiring substrate of the present invention.
Figure 8B:
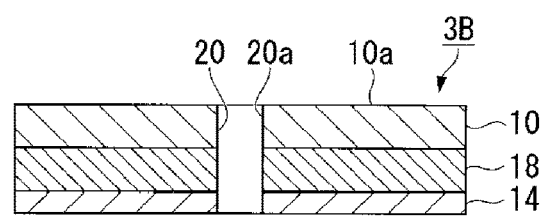
FIG. 8B is a cross-sectional view illustrating a state where a hole is formed in the laminate shown in FIG. 8A.
Figure 8C:
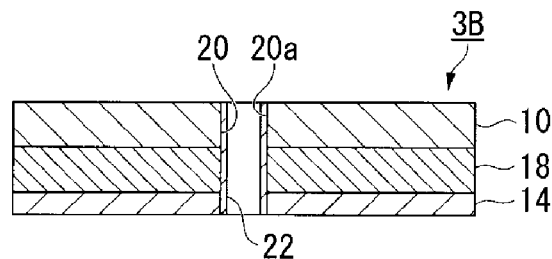
FIG. 8C is a cross-sectional view illustrating a state where a plating layer is formed on an inner wall surface of the hole in the laminate shown in FIG. 8B.
Figure 8D:
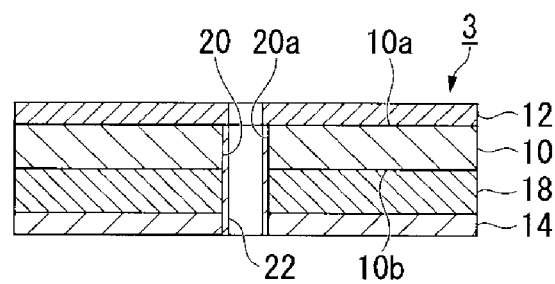
FIG. 8D is a cross-sectional view illustrating a state where a first conductor layer is formed on the first surface side of the layer (A) of the laminate shown in FIG. 8C.

In a case where a wiring substrate 3 is produced by the process (ii), a laminate 3B having a layer structure of layer (A) 10/layer (B) 18/second conductor layer 14 as shown in FIG. 8A is used. In the same manner as in the case of the wiring substrate 1, as shown in FIG. 8B, a hole 20 which penetrates from the layer (A) 10 through the second conductor layer 14 is formed in the laminate 3B. And, either one or both of a treatment with a permanganic acid solution and a plasma treatment is applied to an inner wall surface 20a of the hole 20 without conducting an etching treatment using metal sodium. Then, as shown in FIG. 8C, a plating layer 22 is formed on the inner wall surface 20a of the hole 20, and as shown in FIG. 8D, a first conductor layer 12 is formed on a first surface 10a side of the layer (A) 10.

Ninth Embodiment

Figure 9A:
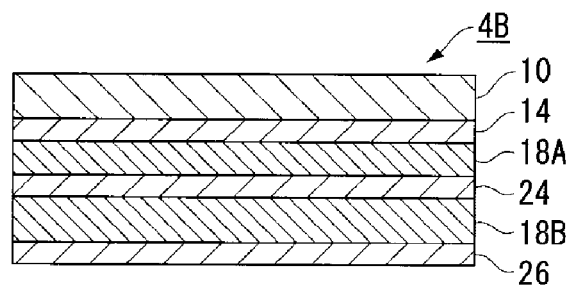
FIG. 9A is a cross-sectional view illustrating an example of a laminate used for a process for producing a wiring substrate of the present invention.
Figure 9B:
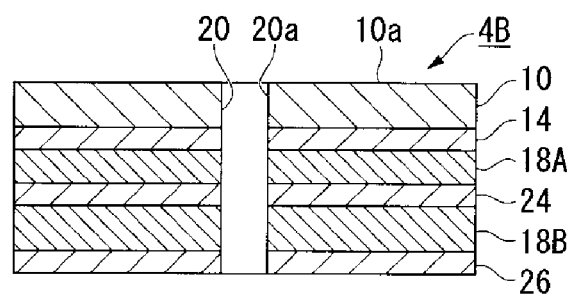
FIG. 9B is a cross-sectional view illustrating a state where a hole is formed in the laminate shown in FIG. 9A.
Figure 9C:
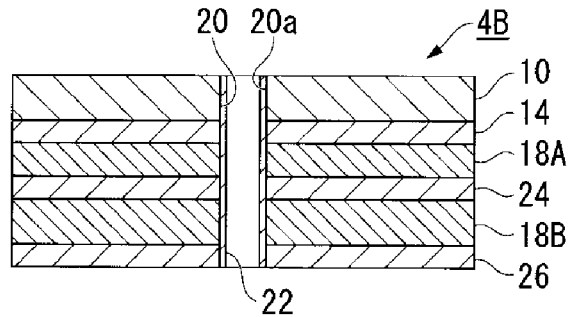
FIG. 9C is a cross-sectional view illustrating a state where a plating layer is formed on an inner wall surface of the hole in the laminate shown in FIG. 9B.
Figure 9D:
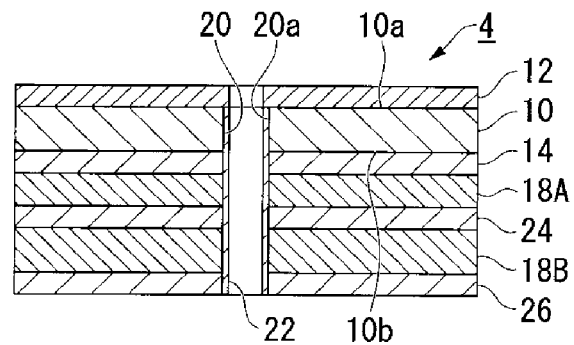
FIG. 9D is a cross-sectional view illustrating a state where a first conductor layer is formed on the first surface side of the layer (A) of the laminate shown in FIG. 9C.

In a case where a wiring substrate 4 is produced by the process (ii), as shown in FIG. 9A, a laminate 4B having a layer structure of layer (A) 10/second conductor layer 14/layer (B) 18A/third conductor layer 24/layer (B) 18B/fourth conductor layer 26 as shown in FIG. 9A is used. In the same manner as in the case of the wiring substrate 1, as shown in FIG. 9B, a hole which penetrates from the layer (A) 10 through the fourth conductor layer 26 is formed in the laminate 4B, and as shown in FIG. 9C, a plating layer 22 is formed on an inner wall surface 20a of the hole 20. Then, as shown in FIG. 9D, a first conductor layer 12 is formed on a first surface 10a side of the layer (A) 10.

The laminate 4B is obtained, for example, by bonding a precursor laminate having the layer (A) 10 and the second conductor layer 14 laminated and a precursor laminate having the third conductor layer 24, the layer (B) 18B and the fourth conductor layer 26 laminated, via a prepreg containing an uncured thermosetting resin and then by curing the prepreg. In such a case, the cured product of the prepreg becomes the layer (B) 18A.

Tenth Embodiment

Figure 10A:
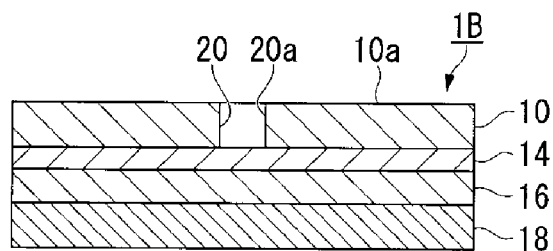
FIG. 10A is a cross-sectional view illustrating a state where a hole is formed in the laminate shown in FIG. 6A.
Figure 10B:
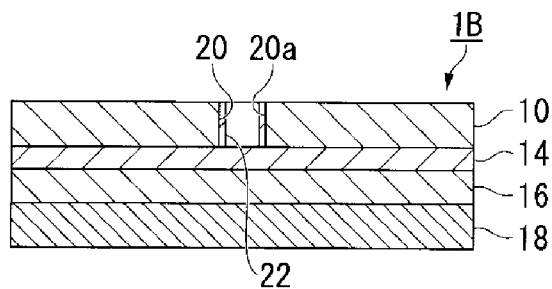
FIG. 10B is a cross-sectional view illustrating a state where a plating layer is formed on an inner wall surface of the hole in the laminate shown in FIG. 10A.
Figure 10C:
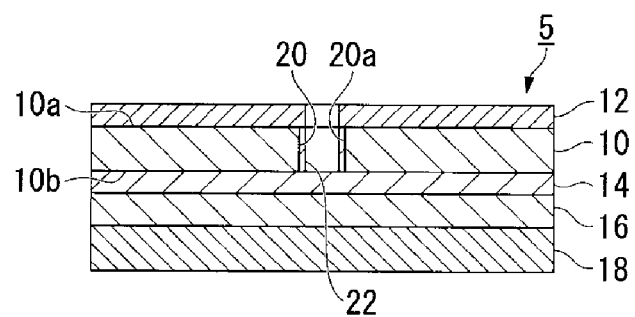
FIG. 10C is a cross-sectional view illustrating a state where a first conductor layer is formed on the first surface side of the layer (A) of the laminate shown in FIG. 10B.

In a case where a wiring substrate 5 is produced by the process (ii), the same laminate 1B as in the case of the wiring substrate 1 as shown in FIG. 6A is used. As shown in FIG. 10A, a hole 20 is formed from the outer surface of the layer (A) 10 to the boundary between the layer (A) 10 and the second conductor layer 14 is formed in the laminate 1B. Then, in the same manner as in the case of the wiring substrate 1, as shown in FIG. 10B, a plating layer 22 is formed on an inner wall surface 20a of the hole 20, and as shown in FIG. 10C, a first conductor layer 12 is formed on a first surface 10a side of the layer (A) 10.

As described above, in the process for producing a wiring substrate of the present invention, a laminate having the layer (B) in addition to the first conductor layer, the layer (A) and the second conductor layer is used. By the layer (B) being laminated, adhesion between the inner wall surface of the hole and the plating layer is sufficiently secured even without conducting an etching treatment using metal sodium to the hole formed in the layer (A). Accordingly, the plating layer is formed on the entire inner wall surface of the hole, and conduction failure in the hole can be suppressed.

In the process for producing a wiring substrate of the present invention, since an etching treatment using metal sodium is unnecessary, existing equipment for producing a wiring substrate using a resin containing no fluorine atom as an insulating material may be utilized.

EXAMPLES

Now, the present invention will be described in further detail with reference to Examples. However, it should be understood that the present invention is by no means restricted thereto.

[Copolymer Composition]

In the copolymer composition of the fluororesin, the proportion (mol %) of NAH units was determined by the following infrared absorption spectrum analysis. The proportions of other units were determined by molten NMR analysis and fluorine content analysis.

(Measurement of Proportion of NAH Units)

The fluororesin was press-formed to obtain a 200 μm film, which was subjected to infrared absorption spectrum analysis. In the obtained infrared absorption spectrum, the absorbance of an absorption peak at 1,778 $cm^{-1}$ which is an absorption peak of NAH units was measured. The absorbance was divided by the NAH molar absorption coefficient 20,810 $mol^{-1} \cdot l \cdot cm^{-1}$ to determine the proportion of NAH units in the fluororesin.

[Melting Point]

Using a differential scanning calorimeter (DSC apparatus) manufactured by Seiko Instruments & Electronics Ltd., the melting peak when the fluororesin was heated at a rate of 10° C./min was recorded, and the temperature (° C.) corresponding to the maximum value of the melting peak was taken as the melting point (Tm).

[MFR]

Using a melt indexer manufactured by TECHNO SEVEN, the mass (g) of the fluororesin which flowed from a nozzle having a diameter of 2 mm and a length of 8 mm in 10 minutes (unit time) at 372° C. under a load of 49 N was measured and taken as MFR (g/10 min).

[Measurement of Dielectric Constant of Fluororesin]

Using a dielectric breakdown test apparatus (YSY-243-100RHO (manufactured by YAMAYOSHIKENKI.COM)), by transformer bridge method in accordance with ASTM D150, the dielectric constant of the fluororesin was measured at a frequency of 1 MHz in a test environment at a temperature of 23° C.±2° C. under a relative humidity of 50%±5% RH.

[Measurement of Dielectric Constant of Fluororesin Material]

The copper foil of a double-sided copper-clad laminate was removed by etching, and with respect to the obtained fluororesin material, by split post dielectric resonator method (SPDR method), the dielectric constant at a frequency of 2.5 GHz was obtained in an environment at 23° C.±2° C. under 50%±5% RH.

As equipment in measurement of the dielectric constant, split post dielectric resonator of nominal fundamental frequency 2.5 GHz type manufactured by QWED, vector network analyzer E8361C manufactured by Keysight Technologies and 85071E option 300 dielectric constant calculation software manufactured by Keysight Technologies were used.

[Measurement of Linear Expansion Coefficient]

The copper foil of a double-sided copper-clad laminate is removed by etching, and the exposed fluororesin layer is cut into a strip of 4 mm×55 mm to prepare a sample. The sample is dried in an oven at 250° C. for 2 hours for conditioning. Then, the sample is heated from 30° C. to 250° C. at a rate of 5° C./min using a thermal mechanical analyzer (TMA/SS6100) manufactured by Seiko Instruments Inc., in an air atmosphere at a distance between chucks of 20 mm while applying a load of 2.5 g, and the amount of displacement accompanying the linear expansion of the sample is measured. After completion of measurement, the linear expansion coefficient (ppm/° C.) from 50 to 100° C. is determined from the amount of displacement of the sample from 50 to 100° C.

[Evaluation of Plating Layer]

With respect to the wiring substrate obtained in each Ex., the outer appearance of the plating layer formed on the inner wall surface of the hole was observed, and evaluation was made based on the following standards.

○ (Excellent): The plating layer formed on the entire inner wall surface of the hole.

x (Failure): The plating layer formed partially on the inner wall surface of the hole, and a part of the inner wall surface of the hole exposed.

[Materials Used]

NAH: 5-norbornene-2,3-dicarboxylic anhydride (himic anhydride, manufactured by Hitachi Chemical Company, Ltd.)

AK225cb: 1,3-dichloro-1,1,2,2,3-pentafluoropropane (AK225cb, manufactured by Asahi Glass Company, Limited)

PPVE: $CF_2=CFO(CF_2)_3F$ (manufactured by Asahi Glass Company, Limited)

Production Example 1

369 kg of AK225cb and 30 kg of PPVE were charged into a polymerization vessel equipped with a stirring machine having an internal capacity of 430 L (liter) which had been deaerated. Then, the interior of the polymerization vessel was heated to 50° C., 50 kg of TFE was charged, and the pressure in the polymerization vessel was elevated to 0.89 MPa/G. "/G" means that the pressure is the gage pressure.

(Perfluorobutyryl) peroxide and PPVE were dissolved in AK225cb at concentrations of 0.36 mass % and 2 mass %, respectively, to prepare a polymerization initiator solution. Polymerization was conducted while 3 L of the polymerization initiator solution was continuously added to the polymerization vessel at a rate of 6.25 mL per minute. During the polymerization reaction, TFE was continuously charged so that the pressure in the polymerization vessel was kept at 0.89 MPa/G. Further, a solution having NAH dissolved in AK225cb at a concentration of 0.3 mass % was continuously charged at a rate of 0.1 mol % based on the number of moles of TFE charged during the polymerization reaction.

8 hours after initiation of the polymerization, at a point when 32 kg of TFE was charged, the temperature in the polymerization vessel was decreased to room temperature, and the pressure was purged to normal pressure. The obtained slurry was subjected to solid-liquid separation from AK225cb, followed by drying at 150° C. for 15 hours to obtain 33 kg of a granular fluororesin (a1-1).

The copolymer composition of the fluororesin (a1-1) was NAH units/TFE units/PPVE units=0.1/97.9/2.0 (mol %). The melting point of the fluororesin (a1-1) was 300° C., the dielectric constant was 2.1, and MFR was 17.6 g/10 min. Further, the content of the functional groups (Q) (acid anhydride groups) in the fluororesin (a1-1) was 1,000 groups per $1×10^6$ carbon atoms in the main chain of the fluororesin (a1-1).

Production Example 2

Using a single screw extruder of 30 mm in diameter having a coat hanger die with a width of 750 mm, the fluororesin (a1-1) was extruded at a die temperature of 340° C. to obtain a fluororesin film (hereinafter referred to as "film (1)") having a thickness of 30 μm. An electrolytic copper foil having a thickness of 12 μm (manufactured by Fukuda Metal Foil & Powder Co., Ltd., CF-T4X-SVR-12, surface roughness (Rz): 1.2 μm), the film (1) and a glass cloth (1) (manufactured by Arisawa Mfg. Co., Ltd., glass cloth 0634NS, unit area mass: 48.5 g/m², porosity: 4.5%) were laminated in the order of copper foil/film (1)/film (1)/glass cloth (1)/film (1)/film (1)/copper foil and vacuum-pressed at a temperature of 360° C. under a pressure of 3.7 MPa for 10 minutes to prepare a double-sided copper-clad laminate (α-1). In the double-sided copper-clad laminate (α-1), by the portion of film (1)/film (1)/glass cloth (1)/film (1)/film (1) being pressed, a fluororesin layer (A-1) was formed.

The copper foils on both surfaces of the double-sided copper-clad laminate (α-1) were removed by etching, and the thickness of the fluororesin layer (A-1) was measured, whereupon it was 168 μm. Further, of the fluororesin layer (A-1), the dielectric constant was 2.6, and the linear expansion coefficient was 18 ppm/° C.

Production Example 3

The double-sided copper-clad laminate (α-1), a prepreg (C-1) having a thickness of 60 μm, having a substrate formed by stretch-assembling glass fibers in one direction impregnated with an uncured thermosetting resin (glass epoxy bonding sheet R-1661, manufactured by Panasonic Corporation) and a double-sided copper-clad laminate (β-1) having a copper foil bonded to both surfaces of a glass epoxy substrate having a thickness of 400 μm were laminated in the order of α-1/C-1/β-1, and pressed at a temperature of 180° C. under a pressure of 3.7 MPa to prepare laminate (I). By pressing, the thermosetting resin in the prepreg (C-1) was cured to be a cured product. In the laminate (I), the glass epoxy substrate corresponds to the layer (B-1) and the cured product of the thermosetting resin in the prepreg (C-1) corresponds to the layer (B-2).

Example 1

On the laminate (I) obtained in Production Example 3, hole processing of 0.3 mm in diameter was conducted by a drill to form a hole (through-hole) which penetrated from one surface to the other surface of the laminate (I). Then, a desmear treatment (treatment with a permanganic acid solution) was applied to the inner wall surface of the hole formed. The laminate (I) having the through-hole formed therein was treated with a swelling liquid (a mixed liquid of MLB211 and CupZ in a mixing ratio of 2:1 by mass manufactured by RHOM and HAAS) at a liquid temperature of 80° C. for a treatment time of 5 minutes, treated with an oxidizing liquid (a mixed liquid of MLB213A-1 and MLB213B-1 in a mixing ratio of 1:1.5 by mass manufactured by RHOM and HAAS) at a liquid temperature of 80° C. for a treatment time of 6 minutes and treated with a neutralizer (MLB216-2 manufactured by RHOM and HAAS) at a liquid temperature of 45° C. for a treatment time of 5 minutes.

In order to form a plating layer on the inner wall surface of the through-hole in the laminate (I) after the desmear treatment, a plating treatment was applied to the inner wall surface of the through-hole in the laminate (I). With respect to the plating treatment, a system solution is commercially available from RHOM and HAAS, and electroless plating was conducted using the system solution in accordance with the published procedure. The laminate (I) after the desmear treatment was treated with a cleaning fluid (ACL-009) at a liquid temperature of 55° C. for a treatment time of 5 minutes. After washing with water, the laminate (I) was subjected to a soft etching to treatment with a sodium persulfate/sulfuric acid soft etching agent at a liquid temperature of room temperature for a treatment time of 2 minutes. After washing with water, the laminate (α-1) was subjected to an activation treatment with a treatment liquid (a mixed liquid of MAT-2-A and MAT-2-B in a volume ratio of 5:1) at a liquid temperature of 60° C. for a treatment time of 5 minutes. The laminate (I) was subjected to a reduction treatment with a treatment liquid (a mixed liquid of MAB-4-A and MAB-4-B in a volume ratio of 1:10) at a liquid temperature of 30° C. for a treatment time of 3 minutes so that a Pd catalyst to precipitate copper in electroless plating was deposited on the inner wall surface of the through-hole. After washing with water, the laminate (α-1) was subjected to a plating treatment with a treatment liquid (PEA-6) at a liquid temperature of 34° C. for a treatment time of 30 minutes to precipitate copper on the inner wall surface of the through-hole to form a plating layer thereby to obtain a wiring substrate.

Example 2

On the laminate (I) obtained in Production Example 3, hole processing of 0.3 mm in diameter was conducted by a drill to form a hole (through-hole) which penetrated from one surface to the other surface of the laminate (I). Then, to the inner wall surface of the hole formed, a treatment with a permanganic acid solution using a desmear liquid containing permanganic acid sodium salt was applied in the same manner as in Example 1 and further a plasma treatment was applied in an argon gas atmosphere. Then, on the inner wall surface of the hole, in the same manner as in Example 1, a plating layer comprising copper was formed by electroless plating to obtain a wiring substrate.

Example 3

On the laminate (I) obtained in Production Example 3, hole processing of 0.3 mm in diameter was conducted by a drill to form a hole (through-hole) which penetrated from one surface to the other surface of the laminate (I). Then, to the inner wall surface of the hole formed, a treatment with a permanganic acid solution was applied in the same manner as in Example 1 except that an ultrasonic wave treatment at 28 kHz was conducted in each of the treatment steps with the respective liquids, and then a plating layer comprising copper was formed on the inner wall surface of hole by electroless plating thereby to obtain a wiring substrate.

Comparative Example 1

In the double-sided copper-clad laminate (α-1) obtained in Production Example 2, hole processing of 0.3 mm in diameter was conducted by a drill to form a through-hole. Then, to the inner wall surface of the hole formed, a treatment with a permanganic acid solution was applied using a desmear liquid containing permanganic acid sodium salt, and a plating layer comprising copper was formed by electroless plating on the inner wall surface of the hole to obtain a wiring substrate.

TABLE 1

| Laminate | | Pre-treatment of hole | | |
| --- | --- | --- | --- | --- |
| structure of wiring substrate | Diameter of hole [mm] | Treatment with permanganic acid solution | Plasma treatment | Evaluation of plating layer |
| Example 1 | α-1/B-2/β-1 | 0.3 | Conducted | Nil | ○ |
| Example 2 | α-1/B-2/β-1 | 0.3 | Conducted | Conducted | ○ |
| Example 3 | α-1/B-2/β-1 | 0.3 | Conducted | Nil | ○ |
| Comp. Example 1 | α-1 | 0.3 | Conducted | Nil | x |

As shown in Table 1, in the wiring substrates in Examples 1, 2 and 3, the plating layer was formed on the entire inner wall surface of the hole.

Whereas in the wiring substrate in Comparative Example 1, the plating layer was formed only partially on the inner wall surface of the hole.

This application is a continuation of PCT Application No. PCT/JP2016/081169, filed on Oct. 20, 2016, which is based upon and claims the benefit of priority from Japanese Patent Application No. 2015-208153 filed on Oct. 22, 2015. The contents of those applications are incorporated herein by reference in their entireties.

REFERENCE SYMBOLS 1 to 4: wiring substrate, 10: layer (A), 10a: first surface, 10b: second surface, 12: first conductor layer, 14: second conductor layer, 16: adhesive layer, 18: layer (B), 20: hole, 20a: inner wall surface, 22: plating layer, 24: third conductor layer, 26: fourth conductor layer

What is claimed is:
1. A process for producing a wiring substrate comprising:
a layer (A) which is made of a fluororesin material containing a melt-moldable fluororesin (a) having at least one type of functional groups selected from the group consisting of carbonyl group-containing groups, hydroxy groups, epoxy groups and isocyanate groups, and a reinforcing fiber substrate made of woven fabric or non-woven fabric, and which has a dielectric constant of from 2.0 to 3.5;

a first conductor layer formed on a first surface side of the layer (A);
a second conductor layer formed on a second surface side opposite from the first surface of the layer (A); and
at least one layer (B) made of a cured product of a thermosetting resin formed between any two of the layer (A) and the two conductor layers or outside of either of the two conductor layers; and
the wiring substrate having a hole which opens at least from the first conductor layer through the second conductor layer and having a plating layer formed on an inner wall surface of the hole;
the process comprising forming the hole in a laminate comprising the first conductor layer, the layer (A), the second conductor layer and the layer (B); and
applying, to an inner wall surface of the hole formed, at least one of a treatment with a permanganic acid solution and a plasma treatment without conducting an etching treatment using metal sodium, and then forming the plating layer on the inner wall surface of the hole.

2. The process for producing a wiring substrate according to claim 1, wherein the wiring substrate has a layer structure of first conductor layer/layer (A)/second conductor layer/layer (B) or first conductor layer/layer (A)/layer (B)/second conductor layer.

3. The process for producing a wiring substrate according to claim 1, wherein the wiring substrate further has, as layers constituting the wiring substrate, a third conductor layer and a fourth conductor layer and has a layer structure of first conductor layer/layer (A)/second conductor layer/layer (B)/third conductor layer/layer (B)/fourth conductor layer.

4. The process for producing a wiring substrate according to claim 1, wherein the wiring substrate further has, as layers constituting the wiring substrate, an adhesive layer made of a resin material other than a cured product of a thermosetting resin, a third conductor layer and a fourth conductor layer and has a layer structure of first conductor layer/layer (A)/second conductor layer/adhesive layer/third conductor layer/layer (B)/fourth conductor layer.

5. The process for producing a wiring substrate according to claim 1, wherein the functional groups contain at least carbonyl group-containing groups, and the carbonyl group-containing groups are at least one member selected from the group consisting of groups having a carbonyl group between carbon atoms in a hydrocarbon group, carbonate groups, carboxy groups, haloformyl groups, alkoxycarbonyl groups and acid anhydride residues.

6. The process for producing a wiring substrate according to claim 1, wherein the content of the functional groups in the fluororesin (a) is from 10 to 60,000 groups per $1 \times 10^6$ carbon atoms in the main chain of the fluororesin (a).

7. The process for producing a wiring substrate according to claim 1, wherein the layer (A) has a dielectric constant of from 2.0 to 3.0.

8. The process for producing a wiring substrate according to claim 1, wherein the layer (A) has a linear expansion coefficient of from 0 to 35 ppm/° C.

9. The process for producing a wiring substrate according to claim 1, wherein the layer (B) contains glass fibers.

10. A process for producing a wiring substrate comprising:
a layer (A) which is made of a fluororesin material containing a melt-moldable fluororesin (a) having at least one type of functional groups selected from the group consisting of carbonyl group-containing groups, hydroxy groups, epoxy groups and isocyanate groups, and a reinforcing fiber substrate made of woven fabric or non-woven fabric, and which has a dielectric constant of from 2.0 to 3.5;
a first conductor layer formed on a first surface side of the layer (A);
a second conductor layer formed on a second surface side opposite from the first surface of the layer (A); and
at least one layer (B) made of a cured product of a thermosetting resin formed between the layer (A) and the second conductor layer or outside of the second conductor layer; and
the wiring substrate having a hole which opens at least from the first conductor layer through the second conductor layer and having a plating layer formed on an inner wall surface of the hole;
the process comprising forming, in a laminate comprising the layer (A), the second conductor layer and the layer (B), a hole which opens at least from the first surface of the layer (A) through the second conductor layer;
applying, to an inner wall surface of the hole formed, at least one of a treatment with a permanganic acid solution and a plasma treatment without conducting an etching treatment using metal sodium, and then forming the plating layer on the inner wall surface of the hole; and then
forming the first conductor layer on the first surface side of the layer (A).

11. A wiring substrate comprising:
a layer (A) which is made of a fluororesin material containing a melt-moldable fluororesin (a) having at least one type of functional groups selected from the group consisting of carbonyl group-containing groups, hydroxy groups, epoxy groups and isocyanate groups, and a reinforcing fiber substrate made of woven fabric or non-woven fabric, and which has a dielectric constant of from 2.0 to 3.5;
a first conductor layer formed on a first surface side of the layer (A);
a second conductor layer formed on a second surface side opposite from the first surface of the layer (A); and
at least one layer (B) made of a cured product of a thermosetting resin formed between any two of the layer (A) and the two conductor layers or outside of either of the two conductor layers; and
having a hole which opens at least from the first conductor layer through the second conductor layer and having a plating layer formed on an inner wall surface of the hole.

12. The wiring substrate according to claim 11, which has a layer structure of first conductor layer/layer (A)/second conductor layer/layer (B) or first conductor layer/layer (A)/layer (B)/second conductor layer.

13. The wiring substrate according to claim 11, which further has, as layers constituting the wiring substrate, a third conductor layer and a fourth conductor layer and has a layer structure of first conductor layer/layer (A)/second conductor layer/layer (B)/third conductor layer/layer (B)/fourth conductor layer.

14. The wiring substrate according to claim 11, which further has, as layers constituting the wiring substrate, an adhesive layer made of a resin material other than a cured product of a thermosetting resin, a third conductor layer and a fourth conductor layer and has a layer structure of first conductor layer/layer (A)/second conductor layer/adhesive layer/third conductor layer/layer (B)/fourth conductor layer.

15. An antenna, which comprises the wiring substrate as defined in claim 11, wherein at least one of the first conductor layer and the second conductor layer is a conductor layer having an antenna pattern.

* * * * *